United States Patent [19]

Namizaki et al.

[11] Patent Number: 4,728,625
[45] Date of Patent: Mar. 1, 1988

[54] METHOD OF FABRICATING BURIED CRESCENT SEMICONDUCTOR LASER DEVICE BY REMOVING A SURFACE PORTION OF SUBSTRATE AROUND A GROOVE THEREIN

[75] Inventors: Hirofumi Namizaki; Yasushi Sakakibara, both of Hyogo, Japan

[73] Assignee: Mitsubishi Denki Kabushiki Kaisha, Tokyo, Japan

[21] Appl. No.: 777,808

[22] Filed: Sep. 19, 1985

[30] Foreign Application Priority Data

Sep. 19, 1984 [JP] Japan .......................... 59-198121

[51] Int. Cl.⁴ .......................................... H01L 21/208
[52] U.S. Cl. ........................................ 437/91; 437/129; 437/133; 437/972
[58] Field of Search ................... 29/569 L, 576 E; 148/DIG. 95, 175, 171; 357/17, 19, 55; 372/46; 427/87; 156/641, 644, 647, 648, 655; 437/91, 129, 133

[56] References Cited

U.S. PATENT DOCUMENTS

| | | | |
|---|---|---|---|
| 3,697,336 | 10/1972 | Lamolte | 148/171 X |
| 3,713,900 | 1/1973 | Suzuki | 148/1.5 |
| 3,960,618 | 6/1976 | Kawamura et al. | 148/171 |
| 4,033,796 | 7/1977 | Burnham et al. | 148/175 |
| 4,371,966 | 2/1983 | Scifres et al. | 372/45 |
| 4,372,808 | 2/1983 | Triplett et al. | 156/655 |
| 4,425,650 | 1/1984 | Mito et al. | 372/46 |
| 4,454,603 | 6/1984 | Marschall et al. | 372/46 |
| 4,468,850 | 9/1984 | Liau et al. | 29/569 L |
| 4,606,780 | 8/1986 | Liebenzeder et al. | 148/171 |
| 4,637,845 | 1/1987 | Hirako | 437/91 |

FOREIGN PATENT DOCUMENTS 0197183 11/1984 Japan .......................... 29/569 L

OTHER PUBLICATIONS

Hirao et al, "Fabrication and Characterization of Narrow Stripe in GaAs P/Inp Burried Heterostructure Lasers", in *J. Appl. Phys.*, 51(8), Aug. 1980, pp. 4539-4540.

Hirano et al, "Position of the Degradation and the Improved Structure for the Burned Crescent in GaAs P/InP Lasers", in *Appl. Phys. Lett.* 43 (2), 15 Jul. 1983, pp. 187-189.

*Primary Examiner*—Brian E. Hearn
*Assistant Examiner*—T. N. Quach
*Attorney, Agent, or Firm*—Sughrue, Mion, Zinn, Macpeak, and Seas

[57] ABSTRACT

A method of fabricating a semiconductor laser stably operable at high temperatures over long periods of time and with a low leakage current. A semiconductor wafer is prepared including a semiconductor substrate of a first conductivity type and a current blocking layer formed thereon, the current blocking layer including at least one semiconductor layer of a second conductivity type. A groove is formed in the upper surface of the wafer having a depth corresponding to at least the thickness of the current blocking layer. At least surface regions of the wafer are removed in the vicinity of the groove and upper sidewall surface regions of the groove using a semiconductor solution. A plurality of semiconductor crystal layers are then grown on the wafer, including a layer consistuting an active region in the groove, by liquid phase epitaxy.

8 Claims, 3 Drawing Figures

U.S. Patent  Mar. 1, 1988  4,728,625

METHOD OF FABRICATING BURIED CRESCENT SEMICONDUCTOR LASER DEVICE BY REMOVING A SURFACE PORTION OF SUBSTRATE AROUND A GROOVE THEREIN

BACKGROUND OF THE INVENTION

The present invention relates to a method of fabricating a semiconductor laser device operable at a high temperature stably for a prolonged time.

A conventional method of fabricating such a device will be described with reference to FIG. 1. The device shown in FIG. 1, which a so-called "buried crescent" (BC) structure, is composed of an active region 12, which is crescent shaped in cross section, and a current limiting mechanism for concentrating a current flow.

On an n-type InP substrate 1, a p-type InP layer 2 and an n-type InP layer 3 are grown in the stated order by LPE (Liquid Phase Epitaxy) using a saturated solution containing In as a solvent and InP as a solute. Then, a groove 60 having width of 2 microns and depth reaching the substrate 1 is formed by a combination of photolithography and etching. Thereafter, an n-type InP region 11, an active region 12 of p-type InGaAsP or n-type InGaAsP, a p-type InP region 13, and a contact layer 14 of p-type InGaAsP are formed in the stated order by LPE using a saturated solution containing In as a solvent and InP, GaAs, InAs, and dopants, etc., as solutes. The position of the active region 12 is controlled such that opposite ends thereof are in contact with the p-type InP layer 2. Then, an n-type electrode 21 and a p-type electrode 22 are formed on opposite surfaces of the wafer.

In the conventional device fabricated as described above, a p-n junction through which a current flows includes a p-n junction portion which is in contact with the active region 12 and through which a current arising due to a laser oscillation flows, and a p-n junction 50 of InP extending on both sides thereof. The current flowing through the p-n junction 50 does not participate in the laser oscillation function, and therefore it should be as small as possible. The n-type InP region 3 which is buried in the p-type InP region 13 forms a potential barrier against current flow and therefore acts as a slit for concentrating the current to the active region 12.

In order to obtain efficient laser oscillation, it is necessary to concentrate the current in the active region 12. For this purpose, such a slit is effective. However, since the current diverges after passing through the slit, the use of such a slit is not sufficient. The p-n junction of the active region 12 is an InP - InGaAsP heterojunction, or, when the junction is within the active region 12, an InGaAsP homojunction, and the p-n junctions 50 in both sides of the active region are InP homojunctions. There is a difference in junction potential between the p-n junction of the active region 12 and the p-n junctions 50 since the current flows, as defined by exp $(qV_j/kT)$ where $V_j$, q, k and T are the junction potential, electron charge, Boltzmann's constant and absolute temperature, respectively, tend to flow through the p-n junction of the active region 12 rather than through the p-n junctions 50 because the junction potential of the latter is higher than that of the former.

That is, in a semiconductor laser device having a BC structure, a major portion of the current flows concentrate in the active region due to the existence of the two kinds of p-n junctions to thereby obtain efficient laser oscillation. In other words, the junction potential of the p-n junction is determined by parameters of the material and the degree of doping.

If these factors are well selected, the junction potential difference between the p-n junction of the active region 12 and the p-n junction 50 will be a value, for instance, about 0.3 V, which is sufficient to obtain an acceptably great current concentration in the active region. However, if the junction potential difference is lowered due to incompleteness of crystallization, etc., the ineffective current is increased, causing the laser characteristics to be degraded. The more pronounced is this phenomenon, the higher the temperature since the electron energy distribution is broadened. Thus, the laser oscillation characteristic is degraded at high temperatures.

Particularly, for the p-n junctions 50 of InP, the p-n junction in sidewall surfaces of the groove 60 is formed during the second crystal growth for which the surfaces are exposed to a high temperature environment. Therefore, the junctions tend to include many crystal defects, and thus the junction potential of these junctions tends to be lowered. Further, the reduction of junction potential may occur when the laser is operated for a prolonged time for which a current flowing through the active region becomes large enough to degrade the latter, resulting in laser characteristics degradations such as increase of laser threshold value and fading out of oscillation at high temperature. The latter face has been confirmed experimentally by the inventors, as disclosed in "Position of the Degradation and the Improved Structure for the Buried Crescent InGaAsP-/InP (1.3 micron) Laser", *Applied Physics Letters*, vol. 43, pp. 187–189, 15 July 1983.

It has been known that the degradation of laser characteristics mentioned above may be avoided to some extent by a heat treatment of the laser to diffuse in an impurity to thereby shift the p-n junction slightly from the interface exposed to the high temperature. FIG. 2 shows another conventional laser structure in which the above heat treatment is introduced.

In FIG. 2, an n-type InP layer 6 and a p-type InP layer 7 are grown in the stated order on a p-type InP substrate 5 and a groove 60 is formed as before. Then, in the second step, a p-type InP layer 15, an InGaAsP active region 16, an n-tupe InP layer 17, and n-type InGaAsP layer 18 are grown in the stated order on the wafer. At this time, the active region 16 is positioned such that it contacts the p-type InP layer 7. By heat treating the wafer during the second growth step, or heat treating only the p-n junction except for in the active region 16, the junction 50 is shifted in position. Reference numeral 30 depicts a p-type InP region.

With this structure, the p-n junction through which the current flows is separated from the interface exposed to the high temperature ambient, and thus a satisfactory junction characteristic is obtained.

In this conventional laser, however, it is necessary to increase the impurity concentration of either the p-type or the n-type region of the junction (usually, the p-type region since it is more easily moved) to about $10^{18}$ ions/cm$^3$ or more, which reduces the effect of the slit for concentrating the current distribution. Further, because the junction includes regions containing crystal defects, the recombination rate of injected carriers is increased, resulting in a reduction of the junction potential.

SUMMARY OF THE INVENTION

An object of the present invention is to provide a method of fabricating a semiconductor laser device which is operable at high temperatures stably, which device is highly reliable.

According to the present invention, the above object is achieved by introducing into the conventional manufacturing steps a step of partially etching away at least a surface portion of a substrate in the vicinity of a groove and upper sidewall portions of the groove with a solution etchant containing In as a solvent and InP as a solute after these portions are subjected to a high temperature ambient and before LPE growth.

DESCRIPTION OF THE PREFERRED EMBODIMENTS

A preferred embodiment of the present invention will be described with reference to FIG. 3.

Figure 1:
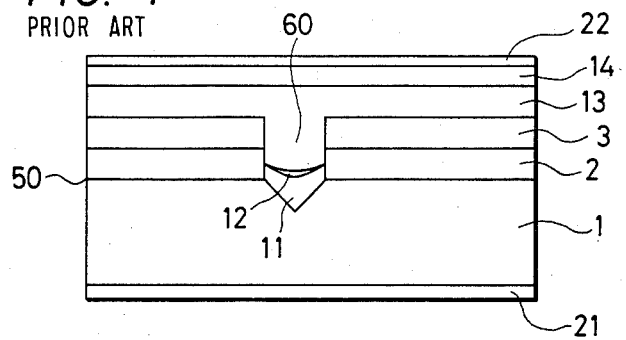
FIG. 1 is a schematic cross section of an example of a conventional laser device having a BC structure.
Figure 2:
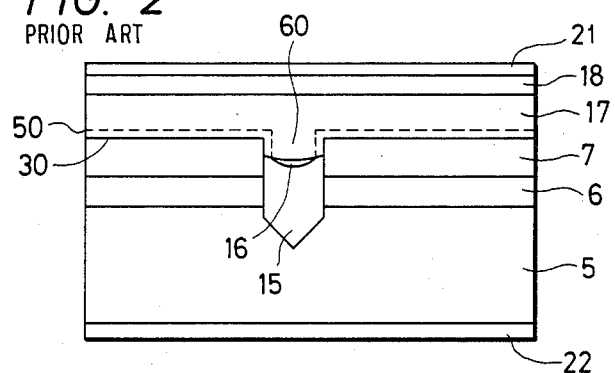
FIG. 2 is a schematic cross section of another example of the conventional laser device.
Figure 3:
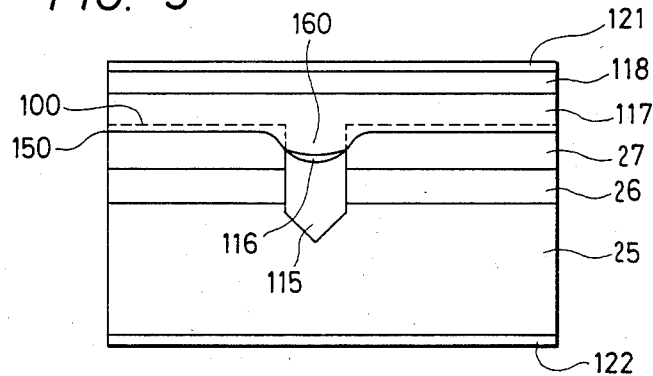
FIG. 3 is a schematic cross section of a laser device constructed according to a preferred embodiment of the present invention.

In FIG. 3, on a semiconductor substrate 25 of a first conductivity type, here, a p-type InP substrate, a current-blocking layer 26 of a second conductivity type, in this case, an n-type InP layer and a p-type InP layer 27, are grown, in the stated order, by LPE in a first step. Then, a groove 160, 2 microns wide, is formed down to the p-type InP substrate 25 by etching. The p-type InP substrate 25, the n-type InP layer 26, the p-type InP layer 27, and the groove 160 form a basic wafer. The crystal surface of the wafer is indicated by reference numeral 100. The layers 121, 118, 117 and 122 correspond to the layers 21, 18, 17 and 22, respectively, of FIG. 2.

A second LPE step is performed on the wafer by forming a plurality of molten saturated solutions each containing In as a solvent and InP, GaAs, InAs, dopants, etc., as solutes in a ratio suitable to precipitate a desired crystal layer in contact with the wafer surface in sequence while cooling gradually. The wafer is subjected to a high temperature each time the solution is melted.

Immediately before the second LPE growth step, the surface of the wafer is etched using a solution, which may be the same as that used to form the first layer in the second step, to remove a portion of the surface 100 of the p-type InP layer 27 to thereby form a new crystal surface, i.e., p-n junction 150. The solution used to etch away this portion may be a nonsaturated solution, the amount of solute in which at the temperature of solution when it is in contact with the wafer is smaller than under thermal equilibrium. An example of such a solution is one containing In and InP in a ratio of 4 g to 24 mg at 623° C. The etching amount is controlled by regulating the amount of solute and the melt contact time. However, a slightly supersaturated solution containing an amount of InP solute which is larger than the saturation amount by, for example, 1 mg or less for 4 g of In solvent at 623° C. may be used for this purpose since, in this case, edge portions tend to be etched away while precipitation may occur around recessed portions, and thus the upper portions of the groove 160 and the areas around them can be etched away.

The first layer 115, i.e., the p-type InP layer, and the active region 116 are formed utilizing LPE growth by which the crystal tends to precipitate in the groove 160 such that there is substantially no crystal growth obtained on flat surface portions. However, even if a thin crystal layer is formed, there may be only a slight shifting of the position of the p-n junction 150, which does not provide any essential difference in effect.

In the laser device fabricated according to the present invention, the p-n junction 150 through which leakage current flows has substantially no crystal defects, and the junction potential thereof is as high as that determined by the material. Therefore, there is obtained a junction potential difference of about 0.3 V between the p-n junction of the active region 116 and p-n junction 150. Consequently, the leakage current is negligibly small compared with the current in the active region 116 (as will be clear from the equation $(qV_j/kT)$ mentioned previously). Thus, the laser device of the invention can oscillate stably at temperatures above even 100° C. Furthermore, due to the substantially crystal defect free p-n junction 150, there is substantially no degradation of leakage current characteristics of the laser device.

In this embodiment, the whole crystal surface of the wafer is etched away. However, it is not always necessary to etch away regions removed from the groove 160 by about 10 microns or more since there is little current in such regions due to the effects of the slit.

Further, although the above semiconductor laser device has been described as being formed of InP/InGaAsP, the present invention is applicable to devices using other materials with substantially the same effect. It should be noted that the configurations of the groove and the slit are mere examples and other configurations can be employed. As mentioned hereinbefore, according to the present invention, in fabricating a semiconductor laser having a BC structure using a two-step LPE process, crystal defects in the p-n junction region outside the active region are minimized by partially removing at least the surface region of the wafer formed by a first LPE step in the vicinity of the groove and the upper sidewall portion of the groove using an appropriate solution after these regions are exposed to a high temperature ambient and before a second LPE step is performed. Therefore, the junction potential is prevented from being lowered and the leakage current is minimized, resulting in stable and efficient laser oscillation for extended periods, even at a high temperature. Hence, the inventive laser device is highly reliable and has a long service life.

We claim:

1. A method of fabricating a semiconductor laser comprising the steps of:

preparing a semiconductor wafer composed of a semiconductor substrate of a first conductivity type and a current blocking layer formed on said semiconductor substrate, said current blocking layer comprising at least one semiconductor layer of a second conductivity type, a groove being formed in an upper surface of said wafer having a depth corresponding to at least a thickness of said current blocking layer, applying a melt-back etching process to the upper surface of said semiconductor wafer such that both the surface regions of said wafer and the upper sidewall surface regions of said groove are removed, while the lower surface regions of said groove are substantially not removed, and growing on said wafer by liquid phase epitaxy, a plurality of semiconductor crystal layers including a layer constituting an active region which is in said groove and is terminated on the etched portions of the side wall of the groove.

2. The method of fabricating a semiconductor laser of claim 1, wherein said solution comprises a solution etchant containing In as a solvent and InP as a solute.

3. The method of fabricating a semiconductor laser of claim 1, wherein said solution comprises a slightly supersaturated solution containing In as a solvent and an amount of InP solute larger than a saturation amount.

4. The method of fabricating a semiconductor laser of claim 1, wherein, in said step of removing at least surface regions of said wafer, only surface regions within approximately 10 microns from said groove are removed.

5. The method of fabricating a semiconductor laser of claim 1, wherein, in said step of removing at least surface regions of said wafer, all said surface regions are removed.

6. The method as claimed in claim 1, wherein said semiconductor substrate is of InP and said active region is of InGaAsP.

7. The method as claimed in claim 6, wherein said first conductivity type is p-type.

8. The method as claimed in claim 1, wherein said first conductivity type is p-type, and wherein said layer constituting said active region is grown at the top of said groove.

* * * * *